(12) United States Patent
Ishihara

(10) Patent No.: US 10,748,840 B2
(45) Date of Patent: *Aug. 18, 2020

(54) CHIP-SIZE, DOUBLE SIDE CONNECTION PACKAGE AND METHOD FOR MANUFACTURING THE SAME

(71) Applicant: Invensas Corporation, San Jose, CA (US)

(72) Inventor: Masamichi Ishihara, Kitakyushu (JP)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/988,218

(22) Filed: May 24, 2018

(65) Prior Publication Data

US 2018/0269141 A1 Sep. 20, 2018

Related U.S. Application Data

(60) Continuation of application No. 14/053,481, filed on Oct. 14, 2013, now Pat. No. 9,984,961, which is a
(Continued)

(30) Foreign Application Priority Data

May 9, 2008 (JP) ................................. 2008-123445

(51) Int. Cl.
*H01L 23/498* (2006.01)
*H01L 23/31* (2006.01)
(Continued)

(52) U.S. Cl.
CPC .. *H01L 23/49811* (2013.01); *H01L 21/76885* (2013.01); *H01L 23/3114* (2013.01);
(Continued)

(58) Field of Classification Search
CPC ..... H01L 2224/73265; H01L 2924/181; H01L 23/3114; H01L 23/481; H01L 23/5226;
(Continued)

(56) References Cited

U.S. PATENT DOCUMENTS 3,968,500 A     7/1976   Meisel et al.
4,700,276 A * 10/1987   Freyman ............. H01L 21/4846
                                                         257/E23.067

(Continued)

FOREIGN PATENT DOCUMENTS

CN         1292635 A     4/2001
EP         1093329 A2    4/2001
(Continued)

OTHER PUBLICATIONS http:/fwww.casio-micronics.co.jp/productfw_csp.html, home page of Casio Micronics Co., Ltd., "W-CSP", Sep. 24, 2010.
(Continued)

*Primary Examiner* — Khiem D Nguyen
(74) *Attorney, Agent, or Firm* — Lerner, David, Littenberg, Krumholz & Mentlik, LLP

(57) ABSTRACT

A low resistance metal is charged into holes formed in a semiconductor substrate to thereby form through electrodes. Post electrodes of a wiring-added post electrode component connected together by a support portion thereof are simultaneously fixed to and electrically connected to connection regions formed on an LSI chip. On the front face side, after resin sealing, the support portion is separated so as to expose front face wiring traces. On the back face side, the semiconductor substrate is grounded so as to expose tip ends of the through electrodes. The front face wiring traces exposed to the front face side and the tip ends of the through electrodes exposed to the back face side are used as wiring for external connection.

21 Claims, 10 Drawing Sheets

Related U.S. Application Data division of application No. 12/991,143, filed as application No. PCT/JP2009/001998 on May 7, 2009, now Pat. No. 8,557,700.

(51) Int. Cl.
    *H01L 23/48*     (2006.01)
    *H01L 23/532*     (2006.01)
    *H01L 21/768*     (2006.01)
    *H01L 23/522*     (2006.01)

(52) U.S. Cl.
CPC ........ *H01L 23/481* (2013.01); *H01L 23/5226* (2013.01); *H01L 23/5328* (2013.01); H01L 2224/0401 (2013.01); H01L 2224/05 (2013.01); H01L 2224/13 (2013.01); H01L 2224/13024 (2013.01); H01L 2224/14181 (2013.01)

(58) Field of Classification Search
CPC ........... H01L 23/3128; H01L 23/49816; H01L 23/49811; H01L 23/3142; H01L 2224/05; H01L 2224/0401
See application file for complete search history.

(56) References Cited

U.S. PATENT DOCUMENTS

| | | | |
|---|---|---|---|
| 5,454,161 A | 10/1995 | Beilin et al. | |
| 5,455,390 A | 10/1995 | DiStefano et al. | |
| 5,483,421 A | 1/1996 | Gedney et al. | |
| 5,629,241 A | 5/1997 | Matloubian et al. | |
| 5,998,861 A | 12/1999 | Hiruta | |
| 6,107,679 A * | 8/2000 | Noguchi | H01L 23/13 257/678 |
| 6,228,676 B1 | 5/2001 | Glenn et al. | |
| 6,365,975 B1 | 4/2002 | DiStefano et al. | |
| 6,646,337 B2 | 11/2003 | Iijima et al. | |
| 7,501,839 B2 | 3/2009 | Chan et al. | |
| 7,510,912 B2 | 3/2009 | Caletka et al. | |
| 7,553,752 B2 | 6/2009 | Kuan et al. | |
| 7,749,882 B2 | 7/2010 | Kweon et al. | |
| 7,759,782 B2 | 7/2010 | Haba et al. | |
| 8,035,192 B2 | 10/2011 | Fujii | |
| 8,071,424 B2 | 12/2011 | Haba et al. | |
| 8,093,705 B2 | 1/2012 | Park et al. | |
| 8,164,158 B2 | 4/2012 | Lin | |
| 8,304,915 B2 | 11/2012 | Mori et al. | |
| 8,372,689 B2 | 2/2013 | Lee et al. | |
| 8,379,400 B2 | 2/2013 | Sunohara | |
| 8,421,210 B2 | 4/2013 | Chi et al. | |
| 8,482,111 B2 | 7/2013 | Haba | |
| 8,492,203 B2 | 7/2013 | Lin et al. | |
| 8,557,700 B2 * | 10/2013 | Ishihara | H01L 23/3114 438/667 |
| 8,692,135 B2 | 4/2014 | Funaya et al. | |
| 8,709,933 B2 | 4/2014 | Haba et al. | |
| 8,736,066 B2 | 5/2014 | Oganesian et al. | |
| 8,841,765 B2 | 9/2014 | Haba et al. | |
| 8,884,427 B2 | 11/2014 | Woychik et al. | |
| 8,900,922 B2 | 12/2014 | Lin et al. | |
| 8,928,132 B2 | 1/2015 | Choi et al. | |
| 8,945,998 B2 | 2/2015 | Hsu et al. | |
| 8,946,884 B2 | 2/2015 | Kwon et al. | |
| 8,978,247 B2 | 3/2015 | Yang et al. | |
| 9,064,718 B1 | 6/2015 | Muniandy et al. | |
| 9,984,961 B2 * | 5/2018 | Ishihara | H01L 23/3114 |
| 2003/0116857 A1 | 6/2003 | Taniguchi et al. | |
| 2003/0151067 A1 | 8/2003 | Iijima et al. | |
| 2003/0155603 A1 | 8/2003 | Liu et al. | |
| 2005/0093152 A1 | 5/2005 | Fjelstad et al. | |
| 2005/0142842 A1 | 6/2005 | Jung | |
| 2006/0022332 A1 | 2/2006 | Koyama et al. | |
| 2006/0040428 A1 | 2/2006 | Johnson | |
| 2006/0076671 A1 * | 4/2006 | Kariya | H01L 23/49811 257/702 |
| 2006/0202322 A1 | 9/2006 | Kariya et al. | |
| 2007/0023888 A1 * | 2/2007 | Fujii | H01L 21/76898 257/698 |
| 2007/0241463 A1 | 10/2007 | Yamaguchi et al. | |
| 2008/0003402 A1 | 1/2008 | Haba et al. | |
| 2008/0007927 A1 | 1/2008 | Ito et al. | |
| 2008/0087459 A1 * | 4/2008 | Das | H05K 1/095 174/260 |
| 2008/0090333 A1 | 4/2008 | Haba et al. | |
| 2008/0108178 A1 | 5/2008 | Wilson et al. | |
| 2008/0155820 A1 | 7/2008 | Arai et al. | |
| 2008/0265430 A1 | 10/2008 | Ishihara | |
| 2009/0115047 A1 | 5/2009 | Haba et al. | |
| 2009/0166811 A1 * | 7/2009 | Fujii | H01L 21/76898 257/621 |
| 2010/0071940 A1 | 3/2010 | Ejiri et al. | |
| 2010/0102426 A1 * | 4/2010 | Park | H01L 21/481 257/686 |
| 2010/0273293 A1 | 10/2010 | Haba et al. | |
| 2010/0320582 A1 | 12/2010 | Pagaila et al. | |
| 2011/0057325 A1 | 3/2011 | Ishihara | |
| 2011/0062549 A1 | 3/2011 | Lin | |
| 2011/0155433 A1 | 6/2011 | Funaya et al. | |
| 2012/0139082 A1 | 6/2012 | Oganesian et al. | |
| 2012/0211885 A1 | 8/2012 | Choi et al. | |
| 2012/0280386 A1 | 11/2012 | Sato et al. | |
| 2013/0050972 A1 | 2/2013 | Mohammed et al. | |
| 2013/0224914 A1 | 8/2013 | Co et al. | |
| 2013/0313012 A1 | 11/2013 | Yang et al. | |
| 2014/0048951 A1 | 2/2014 | Lin et al. | |
| 2014/0077389 A1 | 3/2014 | Shim et al. | |
| 2014/0239479 A1 | 8/2014 | Start | |
| 2015/0115458 A1 | 4/2015 | Palm | |
| 2015/0206815 A1 | 7/2015 | Katkar | |
| 2015/0270232 A1 | 9/2015 | Chen et al. | |
| 2015/0279823 A1 | 10/2015 | Haba et al. | |
| 2016/0079214 A1 | 3/2016 | Caskey et al. | |
| 2017/0162556 A1 | 6/2017 | Lin et al. | |
| 2017/0178993 A1 | 6/2017 | Meyer et al. | |
| 2018/0130759 A1 | 5/2018 | Ho et al. | |

FOREIGN PATENT DOCUMENTS

| | | |
|---|---|---|
| EP | 2555240 A1 | 2/2013 |
| JP | 2001007248 A | 1/2001 |
| JP | 2002050870 A | 2/2002 |
| JP | 3311215 B2 | 8/2002 |
| JP | 2005038898 A | 2/2005 |
| JP | 2005136187 A | 5/2005 |
| JP | 2006210758 A | 8/2006 |
| JP | 2007250561 A | 9/2007 |
| KR | 20010094893 A | 11/2001 |
| KR | 20060111449 A | 10/2006 |
| KR | 20070102481 A | 10/2007 |
| TW | 512467 B | 12/2002 |
| TW | 200512843 A | 4/2005 |
| WO | 2005059993 A2 | 6/2005 |
| WO | 2005101475 A1 | 10/2005 |
| WO | 2009136495 A1 | 11/2009 |

OTHER PUBLICATIONS

International Search Report and Written Opinion for Application No. PCT/JP2009/001998 dated Jun. 23, 2009.
Chinese Office Action for Application No. 201280030721.6 dated Oct. 8, 2014.
International Search Report and Written Opinion for Application No. PCT/US2012/034209 dated Jul. 20, 2012.
Taiwanese Office Action for Application No. 101114254 dated Nov. 6, 2013.

\* cited by examiner

SINGLE CHIP

ENLARGED VIEW OF SINGLE CHIP

BONDING PAD REGION
SILICON SUBSTRATE
LSI REGION

X-X' CROSS-SECTIONAL VIEW

BONDING PAD REGION
LSI REGION
FRONT FACE
BACK FACE
SILICON SUBSTRATE
BONDING PAD REGION

UNIT STRUCTURE

CONNECTED STRUCTURE

X-X' CROSS-SECTIONAL VIEW

THIN FILM

SUPPORT PORTION (a) APPLICATION OF RESIST

PHOTORESIST
MOTHER DIE (b) PATTERNING

PHOTORESIST PATTERN (c) PLATING

PLATING METAL (d) FLATTENING

FLAT SURFACE (e) REMOVAL OF RESIST

REMOVAL OF RESIST (f) SEPARATION

PLATING METAL

CHIP-SIZE, DOUBLE SIDE CONNECTION PACKAGE AND METHOD FOR MANUFACTURING THE SAME

CROSS-REFERENCE TO RELATED APPLICATIONS

The present application is a continuation of U.S. patent application Ser. No. 14/053,481, filed on Oct. 14, 2013 (now U.S. Pat. No. 9,884,961), which is a division of U.S. patent application Ser. No. 12/991,143, filed on Nov. 5, 2010 (now U.S. Pat. No. 8,557,700), which is a National Stage 371 of PCT/JP2009/001998, filed May 7, 2009, which claims priority from Japan Patent Application No. 2008-123445, filed May 9, 2008, the disclosures all of which are incorporated herein by reference.

TECHNICAL FIELD

The present invention relates to a chip-size double side connection package in which a semiconductor chip is connected to wiring for external connection provided on each of first and second main faces respectively located above and blow the semiconductor chip, and to a method for manufacturing the same.

BACKGROUND ART

A chip-size package (CSP) refers to an ultra small package whose smallness and thinness are rendered close to those of an LSI chip to a possible degree. A wafer level chip size package (WLCSP) is known as an ultra small package which is fabricated by means of connecting individual LSIs of a wafer and corresponding electrodes and molding them with resin before the wafer is diced into the individual LSIs (separation); i.e., an ultra small package fabricated through direct packaging on a wafer (see Non-patent Document 1). In Patent Document 1, a double side electrode package which enables different similar packages to be disposed above and below the package in a stacked condition is disclosed as such a wafer level chip size package.

FIG. 16 shows a conventional double side electrode package disclosed in Patent Document 1. A multilayer wiring section is formed on the front face of a semiconductor substrate on which circuit elements are formed. In a stage of forming this multilayer wiring section, holes are formed in the semiconductor substrate, and through electrodes to be connected to the multilayer wiring section are formed in the holes. A back face insulation layer is formed on the back face of the semiconductor substrate such that tip ends of the through electrodes are exposed. Furthermore, post electrodes are connected to the uppermost wiring layer of the multilayer wiring section, and the post electrodes are covered with a front face insulation layer.

Subsequently, on the front face side, bump electrodes are formed on the tip ends of the post electrodes exposed from the front face insulation layer, and, on the back face side, bump electrodes are formed on the tip ends of the through electrodes exposed from the back face insulation layer.

In such a chip-size double side electrode package, both the upper and lower faces are covered with respective insulation layers. This configuration facilitates tests, and allows other packages having similar structures to be freely combined and disposed above and below the chip-size double side electrode package. The area of a completed double side electrode package is small; i.e., completely equal to that of the original chip. In addition, since mounting such a package on a substrate is easy, the package is suitable for high density mounting. Because of this feature, employment of such a double side electrode package in products which is small in mounting space, such as cellular phones and digital cameras, has been spreading.

In general, a semiconductor manufacturing process is divided into a former stage for fabricating an LSI and a latter stage for packaging the LSI. There are a few manufacturers that specialize in the latter stage but can cover the former stage. Manufacture of a conventional wafer level chip size package (WLCSP) requires a process of performing rewiring, post electrode plating, etc. on a wafer; that is, requires facilities similar to those used in the former stage, and cannot be performed by use of only conventional facilities for the latter stage. Therefore, it has not been easy to provide bump electrodes for external connection at positions different from those of the tip ends of post electrodes exposed to the surface of an insulation layer.

PRIOR ART DOCUMENTS

Patent Documents

Patent Document 1: Japanese Patent Application Laid-Open (kokai) No. 2005-136187
Patent Document 2: Japanese Patent Application Laid-Open (kokai) No. 2006-210758

Non-Patent Document

Non-patent Document 1: http://www.casio-micronics.co.jp/product/w_csp.html, home page of Casio Micronics Co., Ltd. "W-CSP"

SUMMARY OF THE INVENTION

Problems to be Solved by the Invention

The present invention has been accomplished so as to solve the above-described problems. An object of the present invention is to provide a chip-size double side connection package which allows other packages having similar structures to be freely combined and disposed above and below the chip-size double side electrode package, and which can be manufactured in such a manner that processes which require facilities similar to those used in the former stage are put together off line in the form of a component. Thus, manufacturers dedicated for the latter stage can enter into manufacture of such packages without large investment, and can readily cope with a future market expansion.

Another object of the present invention is to enable, by simple means, provision of external electrodes at positions different from those of the tip ends of post electrodes.

Means for Solving the Problems

A chip-size double side connection package and a method for manufacturing the same according to the present invention have the following features. A semiconductor chip including a semiconductor substrate on which an LSI region and electrode connection regions are formed is connected to wiring for external connection provided on a first main face and to wiring for external connection provided on a second main face, the first and second main faces being located above and below the semiconductor chip, respectively. A wiring-added post electrode component is formed such that it includes not only post electrodes supported by a support portion but also front face wiring traces connected to the post electrodes. Holes corresponding to through electrodes are formed in the semiconductor substrate at the centers of the electrode connection regions or in the vicinity thereof. A low resistance metal is charged into each of the holes to thereby form the through electrodes. The plurality of post electrodes of the wiring-added post electrode component, which are coupled together by the support portion, are simultaneously fixed to and electrically connected to upper surface regions of the through electrodes or the electrode connection regions. On the first main face side, after resin is charged into a space between the semiconductor chip and the support portion, the support portion is separated so as to expose the front face wiring traces. On the second main face side, the semiconductor substrate is grounded so as to expose tip ends of the through electrodes. The front face wiring traces exposed to the first main face side and the tip ends of the through electrodes exposed to the second main face side are used as wiring for external connection.

External electrodes for external connection may be formed on the front face wiring traces so as to be connected thereto. Further, on the second main face side, a back face insulation layer may be applied to the ground semiconductor substrate such that the tip ends of the through electrodes are exposed, and external electrodes to be connected to the tip ends of the through electrodes may be formed.

Effect of the Invention

According to the present invention, for manufacture of a double side electrode package, which allows other packages having similar structures to be freely combined and disposed above and below the package, processes which require facilities similar to those used in the former stage can be put together off line in the form of a component.

Furthermore, according to the present invention, since the package has a shape similar to a bear chip, and opposite sides of the package can be covered with insulation layers, inspection can be performed thoroughly. In addition, it becomes easier to perform three-dimensional stacking after inspecting the chip-size packages thoroughly so as to confirm that each package is non-defective.

BRIEF DESCRIPTION OF THE DRAWINGS

FIGS. 1(A) to 1(C) are views showing a completed LSI wafer, wherein FIG. 1(A) shows a single wafer on which a plurality of chips are formed in a matrix pattern, FIG. 1(B) is an elongated LSI chip perspective view showing one chip extracted from FIG. 1(A), and FIG. 1(C) is a cross-sectional view taken along line X-X'.

FIGS. 4(A) to 4(C) are views showing the details of a wiring-added post electrode component in which post electrodes with wiring are connected together by means of a plate-shaped support portion, wherein FIGS. 4(A) and 4(B) show a side cross-sectional view and a perspective view, respectively, of a unit structure for a single package, and FIG. 4(C) is a perspective view of a structure in which a plurality of unit structures are connected together.

MODE FOR CARRYING OUT THE INVENTION

Figure 1A:
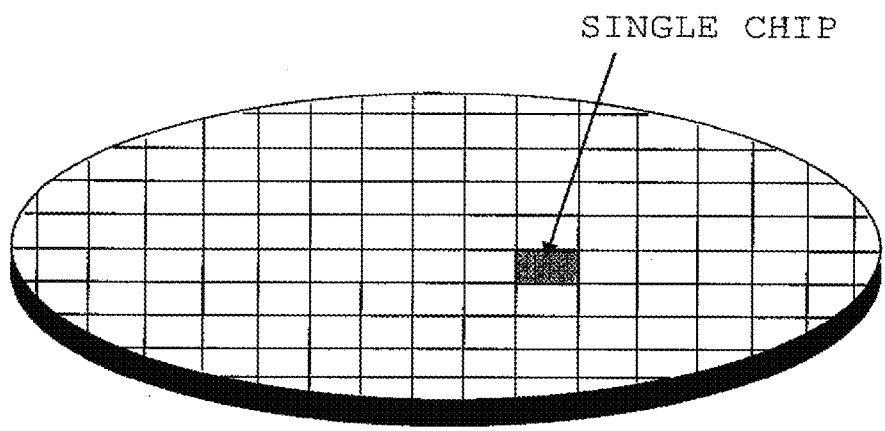
Figure 1B:
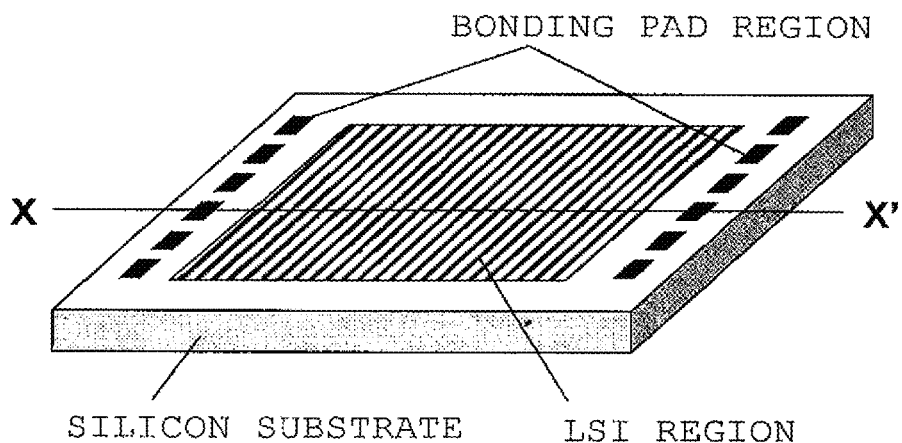
Figure 1C:
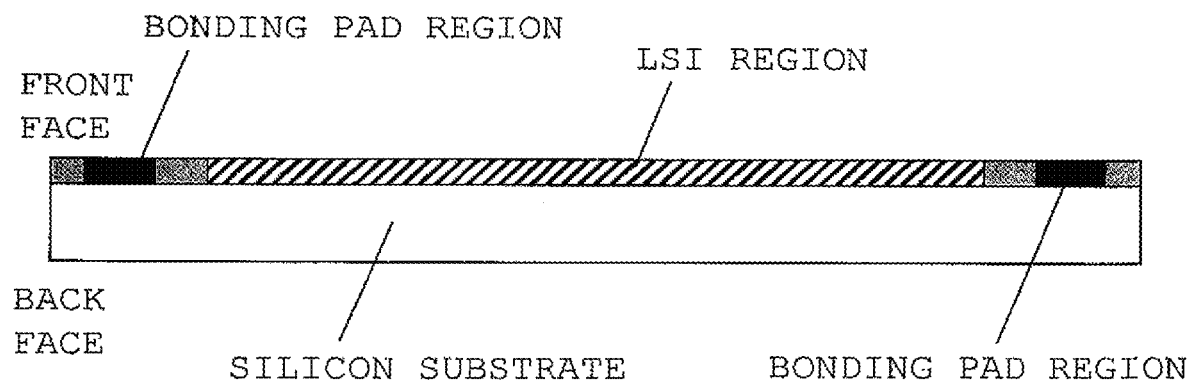

The present invention will now be described by way of example. A chip-size double side connection package according to a first embodiment of the present invention will be described in the order of its manufacturing steps with reference to FIGS. 1 to 10. FIGS. 1(A) to 1(C) are views showing a completed LSI wafer, wherein FIG. 1(A) shows a single wafer on which a plurality of chips are formed in a matrix pattern, FIG. 1(B) is an enlarged LSI chip perspective view showing a single chip extracted from FIG. 1(A), and FIG. 1(C) is a cross-sectional view taken along line X-X'. The LSI chip shown in FIGS. 1(B) and 1(C) is formed on a semiconductor (e.g., silicon) substrate by use of an ordinary semiconductor process technique. An LSI region including an active region and a wring region is formed on the upper surface of the silicon substrate, and a plurality of bonding pad regions to be connected to the LSI region are formed around the LSI region. Both or either of a through electrode and a post electrode to be described later is connected to each of the plurality of bonding pad regions (electrode connection portions). Notably, in the present specification, as shown in FIG. 1(C), the side of the LSI chip on which the silicon substrate is present will be referred to as the "rear face," and the side of the LSI chip on which the LSI region is present will be referred to as the "front face." Notably, an example in which, as will be described later, post electrodes are connected to upper surface regions of through electrodes electrically connected to the bonding pad regions is illustrated and described. However, the post electrodes can be connected simultaneously not only to the upper surface regions of the through electrodes but also the bonding pad regions by means of solder connection (e.g., solder reflow).

Figure 2:
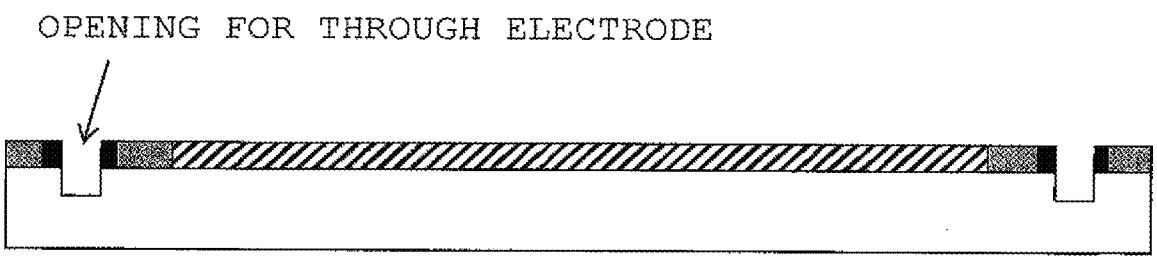
FIG. 2 is a view for describing a step of forming openings for through electrodes.

FIG. 2 is a view for describing a step of forming openings for through electrodes. At the center of each bonding pad region or in the vicinity thereof, a hole corresponding to a through electrode to be described later is formed to extend through the bonding pad region into the silicon substrate. For example, this hole has a diameter of about several µm to 30 µm, and a depth of about 5 to 50 µm. A low resistance metal is charged into the hole to thereby form the through electrode. However, before this, an insulation film is formed on the wall surface of each hole of the silicon substrate. Although the insulation film may be formed through thermal oxidation, it is desired to be formed through deposition at low temperature. Therefore, in the latter case, a nitride film is used as the insulation film. Such a nitride film is formed through deposition of a species produced as a result of a contact decomposing reaction of a source material on a heated catalyst (see Patent Document 2).

Figure 3:
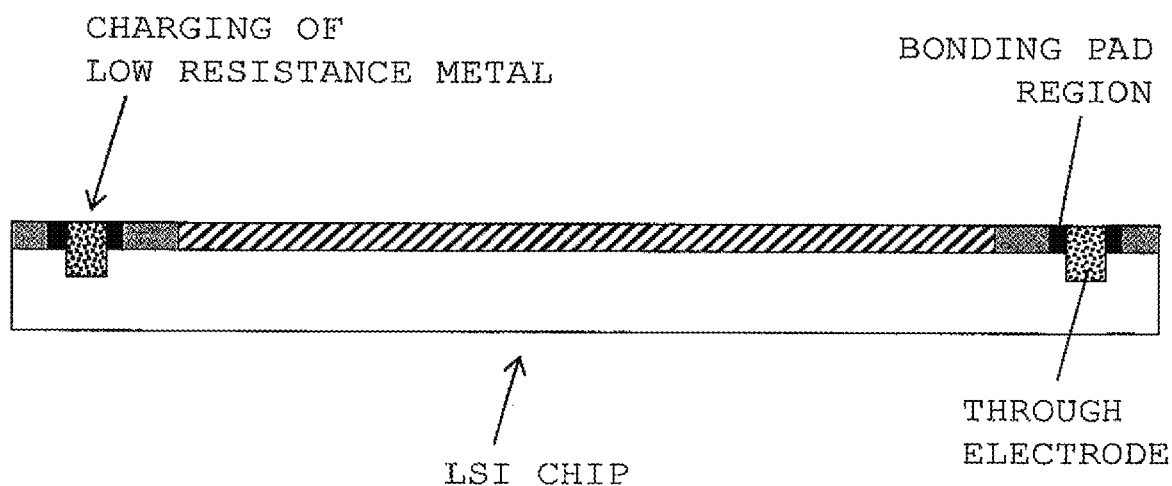
FIG. 3 is a view for describing charging of a low resistance metal.

FIG. 3 is a view for describing charging of a low resistance metal. Charging of a low resistance (electrically conductive metal) may be performed through plating. Alternatively, charging of such a low resistance metal may be performed by use of nanoparticles of metal (copper, silver, gold, etc.) and an ink jet method practically used in the field of printers. Thus, the low resistance charged metal (through electrode) is electrically connected to the corresponding bonding pad region as well.

Figure 4A:
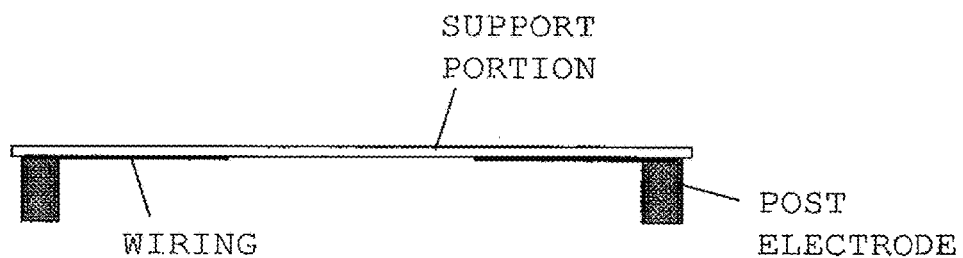
Figure 4B:
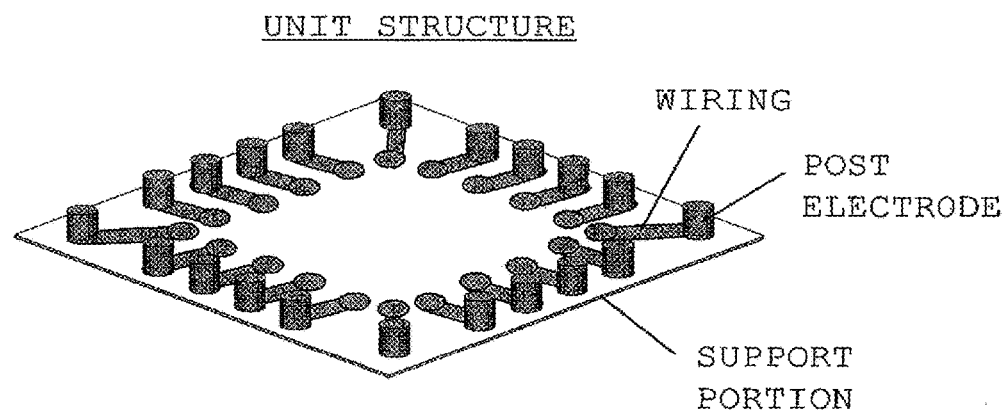
Figure 4C:
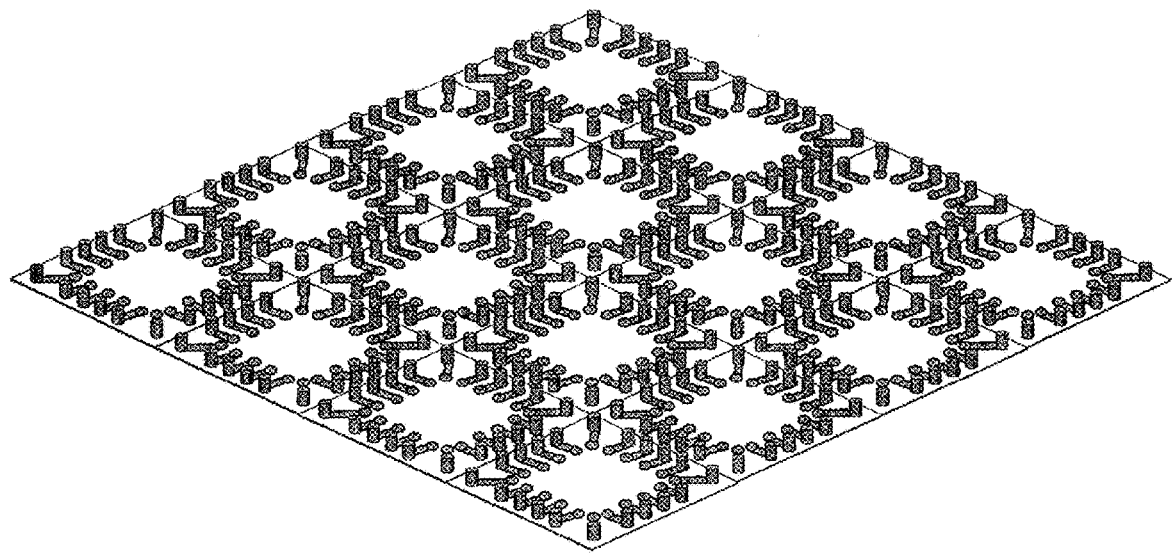

Next, manufacture of a wiring-added post electrode component will be described with reference to FIGS. 4(A) to 4(C). FIGS. 4(A) to 4(C) are views showing the details of a wiring-added post electrode component in which post electrodes with wiring are connected together by means of a plate-shaped support portion, wherein FIGS. 4(A) and 4(B) show a side cross-sectional view and a perspective view, respectively, of a unit structure for a single package, and FIG. 4(C) shows a perspective view of a structure in which a plurality of unit structures for a plurality of packages are connected together. Not only the post electrodes supported by the support portion but also wiring connected thereto is formed through electroforming.

The unit structure and the structure in which a plurality of unit structures are connected together are configured such that a plurality of post electrodes and wiring traces are connected together by a support portion on the back side. The shape of the post electrodes is not limited to the illustrated circular columnar shape, and the post electrodes may have any of other columnar (bar-like) shapes such as a rectangular columnar shape and a polygonal columnar shape. The wiring traces and the post electrodes are fabricated through electroforming.

Electroforming itself is well known. Electroforming is a "method of manufacturing, repairing, or replicating a metal product through electroplating," and is basically the same as electroplating. However, electroforming differs from electroplating in plating thickness, and also differs from electroplating in that an operation of separating a plating film is performed. Further, when a plating film is separated from a mother die and used, control and management of the physical properties of the plating film are important. A material including nickel, copper, a nickel alloy, or a copper alloy may be used in the present invention as a plating metal (conductive material) to be deposited by electroforming. Stainless steel, which is generally used as an electrically conductive material, may be used as the material of the mother die used in the present invention. Alternatively, the mother die may be formed of a silicon substrate which serves as a base and whose surface is covered with a thin oxide film or the like which allows passage of electricity for plating therethrough and which facilitates separation of a plating pattern. The composition of a plating bath and plating conditions must be selected such that no internal stress is produced. In the case of nickel plating, nickel sulfamate bath is used as a plating bath.

Figure 17:
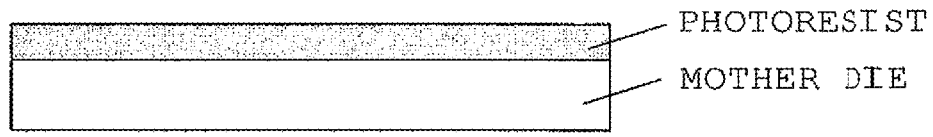
FIG. 17 is a set of process charts showing a method of manufacturing an electroformed component by use of photoresist.
Figure 17:
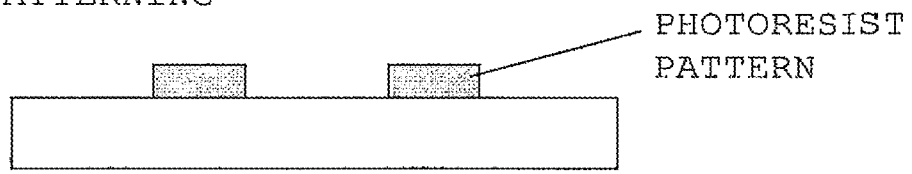
Figure 17:
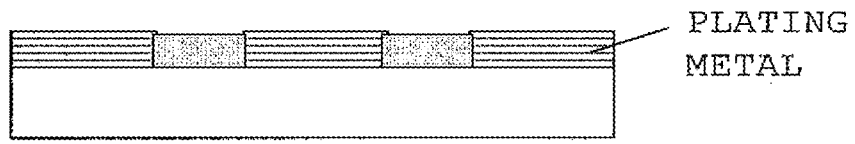
Figure 17:
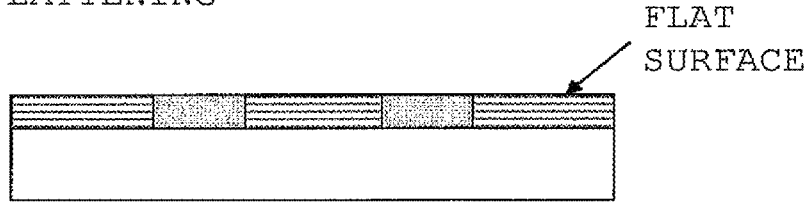
Figure 17:
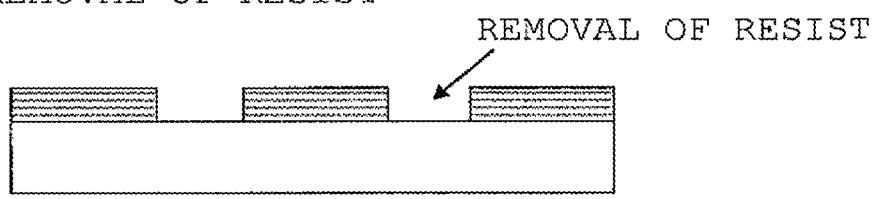
Figure 17:
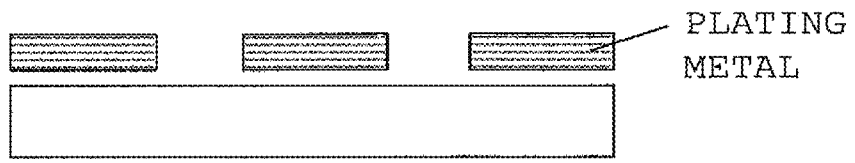

FIG. 17 is a set of process charts showing a method of manufacturing an electroformed component by use of photoresist. Although electroforming will be described below, the manufacturing steps shown in the process charts can be applied to plating (see FIG. 14). In the case of plating (electroless plating), in place of a conductor such stainless steel, an insulating member is used as a mother die, whereby the insulating member can be used as a protection film of a semiconductor device without being removed.

Electroforming is performed as follows. As shown in FIG. 17(a), photoresist (non-conductive film) is applied to an upper surface of a mother die of, for example, stainless steel. Subsequently, the photoresist is exposed to light through a pattern film to thereby form a pattern, followed by development, whereby an original plate for electroforming is formed (FIG. 17(b)). In the case of a chip-size double side connection package, the photoresist pattern of the original plate for electroforming has a thickness greater than that of a product (post electrodes or wiring traces). In the case of the post electrodes, the photoresist pattern has a thickness greater than the thickness of an IC chip; for example, a thickness of about 50 µm to 300 µm. Subsequently, a plating metal is deposited in opening portions of the photoresist pattern (FIG. 17(c)). An anode and a cathode are placed in a plating bath (e.g., nickel sulfamate solution) maintained at a proper temperature. The anode is formed of an electroforming metal to be deposited through electroforming. The cathode is an electroforming mother die of, for example, stainless steel. As shown in FIG. 17(c), a photoresist pattern is previously formed on the surface of the electroforming mother die serving as the cathode. When a current is caused to flow between the anode and the cathode, the electroforming metal of the anode melts, and is plated in the opening portions of the photoresist pattern on the electroforming mother die.

Next, as shown in FIG. 17(d), flattening machining is performed. Subsequently, the resist is removed (FIG. 17(e)), whereby the plating metal forms wiring traces or post electrodes. The wiring traces formed by the plating metal are then separated from the electroforming mother die (FIG. 17(f)). The feature of electroforming resides in that separation of the formed wiring traces and support portion can be readily performed by means of heat and pressure.

For manufacture of a wiring-added post electrode component illustrated in FIGS. 4(A) to 4(C), the steps shown in FIG. 17(a) to FIG. 17(d) are repeated two times. In the first step, wiring traces are formed on the support portion, and, in the second step, post electrodes to be connected to the wiring traces are formed.

As described above, in the manufacture of the wiring-added post electrode component, columnar post electrodes with wiring is grown on an electrically conductive material (ectroforming mother die), which is a support portion, by use of lithography and plating, whereby wiring-added post electrodes integrated with the support portion are formed. After that, the wiring-added post electrode component shown in FIGS. 4(A) to 4(C) is connected and fixed to the LSI chip shown in FIG. 3.

Figure 5:
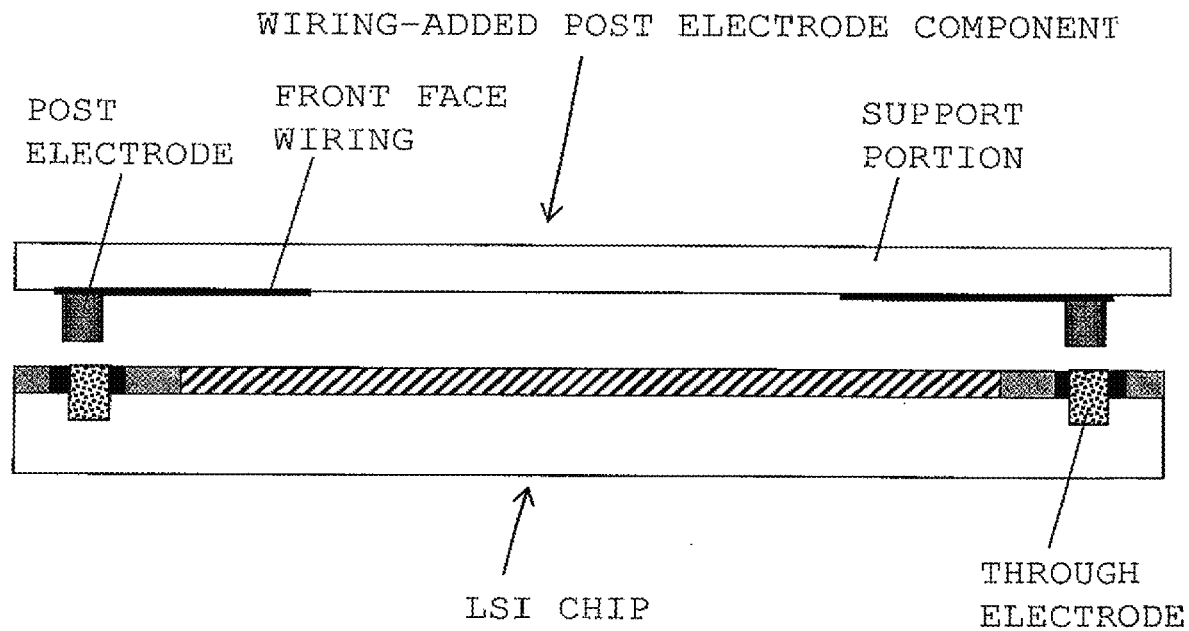
FIG. 5 is a view exemplifying a wiring-added post electrode component and an LSI chip in a state before they are connected together.

FIG. 5 is a view exemplifying a wiring-added post electrode component and an LSI chip in a state before they are connected together. The plurality of post electrodes of the wiring-added post electrode component are simultaneously fixed to and electrically connected to upper surface regions of the through electrodes formed in the LSI chip or the bonding pad regions. With this procedure, the wiring-added post electrode component is coupled to the front face side of the LSI chip. The fixation and connection of the post electrodes may be performed through solder connection. The post electrodes are simultaneously connected to the upper surface regions of the through electrodes or the bonding pad regions by means of performing solder connection (e.g., solder reflow). In a state after the post electrodes are connected to the upper surface regions of the through electrodes, all the post electrodes and the front face wiring are coupled together by means of the plate-shaped support portion.

Figure 6:
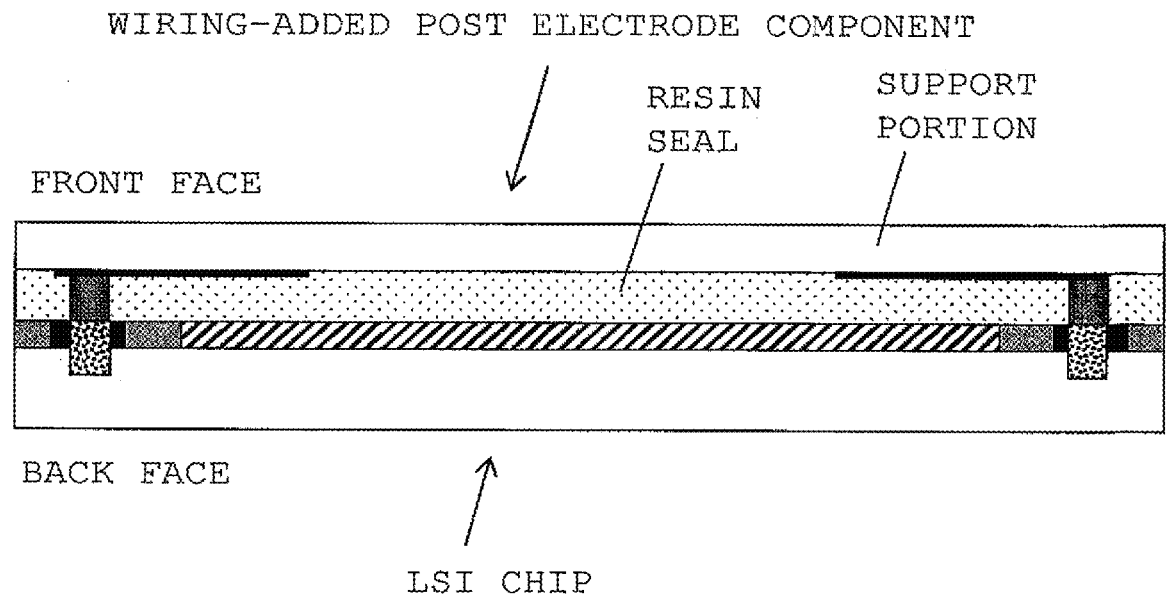
FIG. 6 is a view showing the wiring-added post electrode component and the LSI chip in a state in which the post electrode component is connected and fixed to the LSI chip, and resin-sealed.

FIG. 6 is a view showing the wiring-added post electrode component and the LSI chip in a state in which the post electrode component is connected and fixed to the LSI chip, and resin-sealed. After the wiring-added post electrode component, in which post electrodes with wiring are coupled together by a support portion, is fixed to the LSI chip, the front face of the LSI chip is transfer-molded up to the lower surface of the support portion (the above-described ectroforming mother die); i.e., transfer mold is performed such that the space between the LSI chip and the support portion is filled with resin. Alternatively, the front face of the LSI chip is resin-sealed by use of liquid resin (the material is, for example, an epoxy resin).

Figure 7:
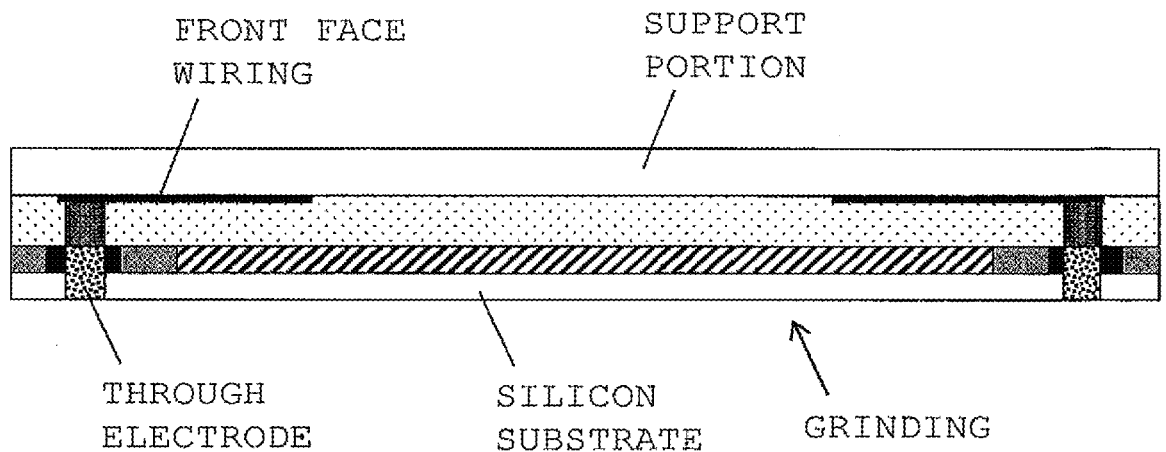
FIG. 7 is a view for describing grinding of a silicon substrate.

FIG. 7 is a view for describing grinding of a silicon substrate. The back face side of the silicon substrate is ground such that tip ends of the through electrodes are exposed to the outside. As a result of the grinding, the thickness of the silicon substrate becomes about 25 μm. Even though the silicon substrate becomes thin as described above, the strength of the overall wafer can be maintained because the wiring-added post electrode component fixed to the LSI chip increases the rigidity of the wafer. Thus, it is possible to prevent damage to the silicon substrate, such as cracking or breakage thereof, which damage would otherwise occur during handling of the silicon substrate.

Figure 8:
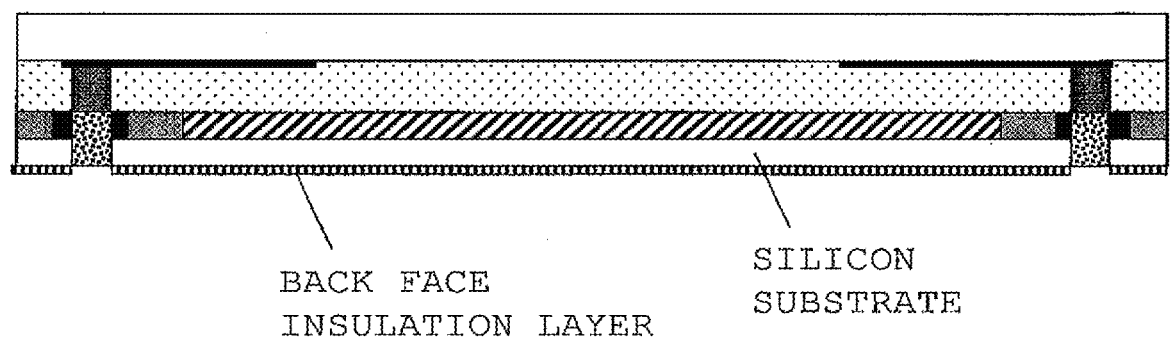
FIG. 8 is a view for describing application of a back face insulation layer.

FIG. 8 is a view for describing application of a back face insulation layer. A back face insulation layer is formed on a silicon surface on the back face side of the silicon substrate. At that time, for example, an insulating material (e.g., an epoxy material) is applied to the silicon surface by an ink jet method, excluding areas corresponding to the through electrodes. Alternatively, after the insulating material is applied to the entire surface, holes are formed at positions corresponding to the through electrodes, whereby the tip ends of the through electrodes are exposed. The thickness of the back face insulation layer is determined such that the back face insulation layer can provide at least electrical insulation.

Figure 9:
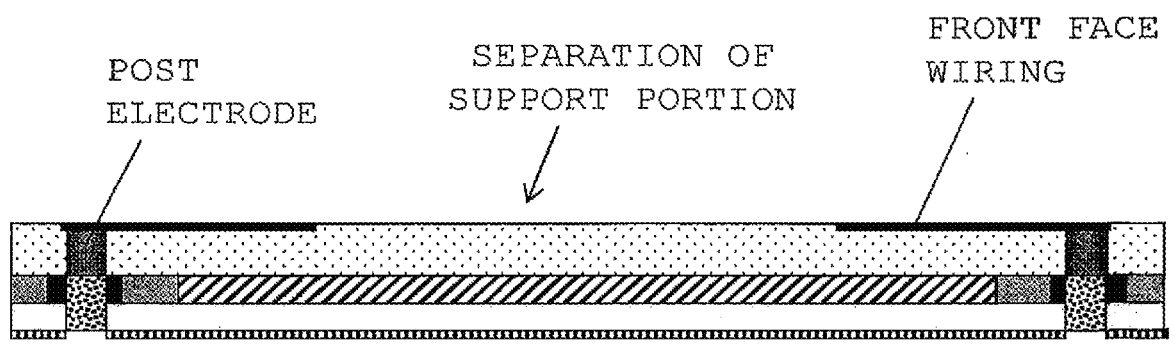
FIG. 9 is a view showing a state after separation of a support portion (electroforming mother die).

FIG. 9 is a view showing a state after separation of the support portion (electroforming mother die). Through separation of the support portion, the plurality of post electrodes (and the front face wiring traces connected thereto) are electrically separated from one another. The device in this state can be used as a completed chip-size double side connection package in which the exposed front face wiring traces and the exposed tip ends of the through electrodes can be used as wiring traces for external connection and electrodes for external connection on the front face and the back face, respectively.

Figure 10:
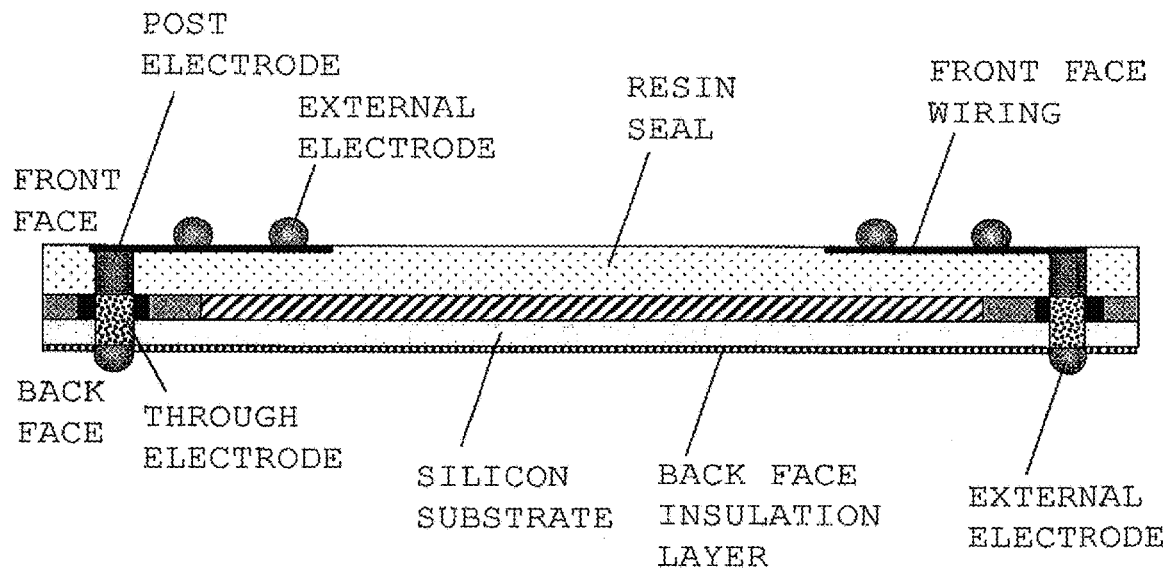
FIG. 10 is a view showing a chip-size double side connection package having bump electrodes formed thereon.

FIG. 10 is a view showing a chip-size double side connection package having bump electrodes formed thereon. On the front face side, external electrodes for external connection (bump electrodes) are formed on the front face wiring traces exposed through separation of the support portion to be connected therewith. If necessary, a protection film (the material is, for example, solder resist) for protecting the upper surfaces of the front face wiring traces may be formed. In such a case, holes are formed in the protection film, and external electrodes are formed there. On the back face side as well, holes are formed in the back face insulation layer at locations where external electrodes (bump electrodes) must be formed, and external electrodes are formed at such locations. After that, the wafer is diced so as to separate LSIs from one another. Alternatively, the wafer may be diced before formation of external electrodes. In manufacture of semiconductor devices, in general, a semiconductor wafer having a wide area is prepared, then undergoes various processes, and finally diced vertically and horizontally to thereby form a large number of semiconductor elements (semiconductor chips). Thus, the chip-size double side connection package is completed.

As described above, according to the present invention, processes for forming rewiring and post electrodes of a chip-size double side connection package can be put together in the form of a wiring-added post electrode component. A conventional wiring layer is formed on the surface of an LSI chip. In contrast, according to the present invention, a wiring layer can be easily formed in a spacious region of the surface of a seal resin portion located outward of the post electrodes.

Figure 11:
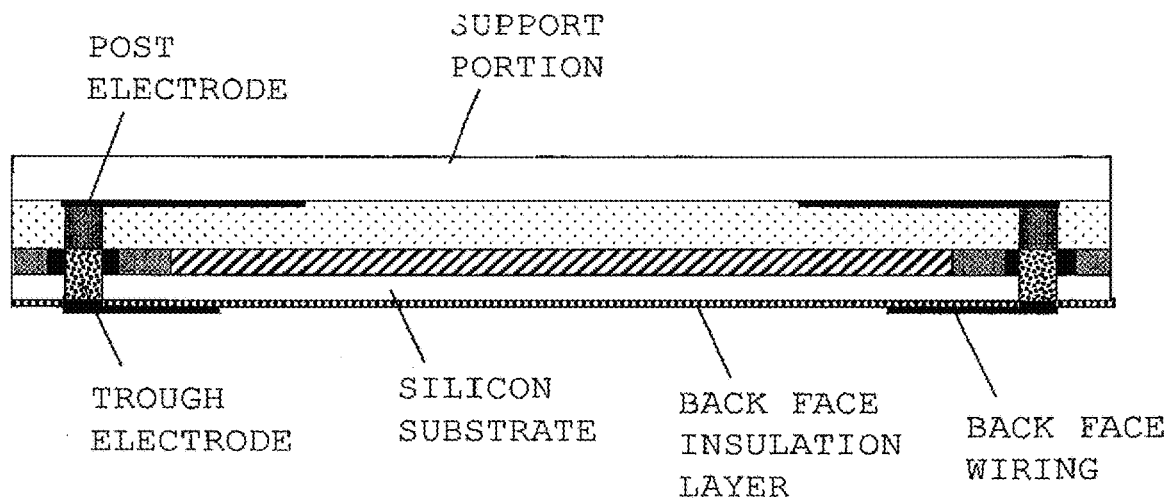
FIG. 11 is a view for describing formation of back face wiring (re-wiring) connected to the exposed ends of through electrodes.

Next, a chip-size double side connection package according to a second embodiment will be described with reference to FIGS. 11 to 13. After the back face insulation layer is applied to the back face of the silicon substrate excluding areas corresponding to the tip ends of the through electrodes as shown in FIG. 8, there are formed back face wiring traces (rewiring) to be connected to the exposed ends of the through electrodes as shown in FIG. 11. The back face wiring traces may be metal particle wiring traces formed by use of metal nanoparticles. The metal particle wiring traces are formed by means of directly patterning a wiring layer; i.e., applying metal nanoparticles by a direct depicting method such as an ink jet method or a screen printing method. A desired pattern is depicted by means of applying organic solvent containing nanoparticles of metal (copper, silver, gold, etc.) by an ink jet method practically used in the field of printers. After that, heat treatment is performed so as to evaporate the organic solvent. Alternatively, in the case of the screen printing method, nanoparticle paste prepared by adding metal nanoparticles to organic solvent is applied onto the back face insulation layer by the screen printing method, followed by heating and firing, whereby circuit wiring can be formed. After this rewiring process performed through formation of metal particle wiring, a process for lowering the resistance may be performed along with removal of the solvent (see Patent Document 2).

Figure 12:
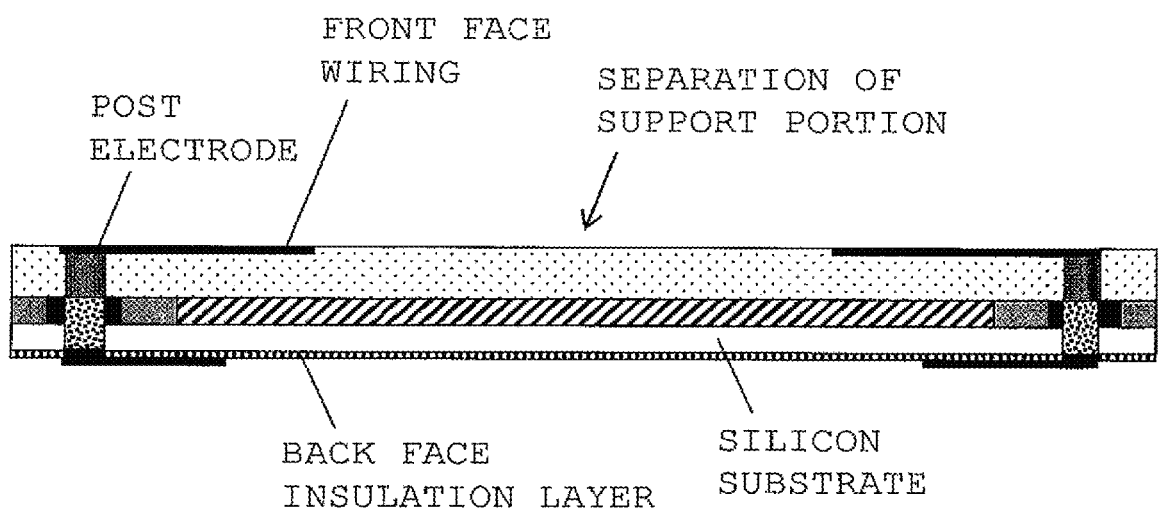
FIG. 12 is a view showing a state after separation of a support portion (electroforming mother die).

FIG. 12 is a view showing a state after separation of the support portion (electroforming mother die). As a result of separation of the support portion, the plurality of post electrodes (and the front face wiring traces connected thereto) are electrically separated from one another.

Figure 13:
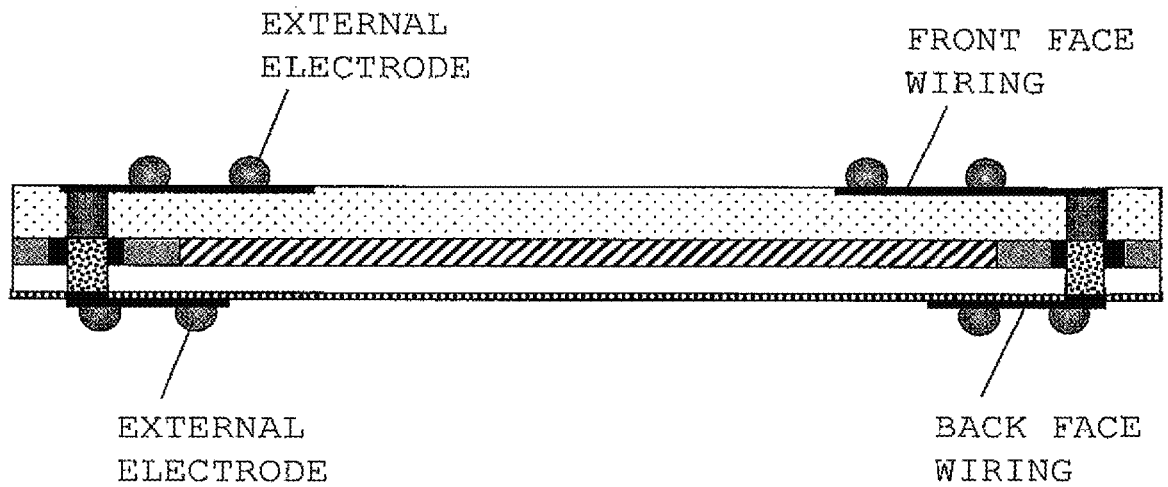
FIG. 13 is a view showing a chip-size double side connection package having bump electrodes formed thereon.

FIG. 13 is a view showing a chip-size double side connection package having bump electrodes formed thereon. The device in a state shown in FIG. 12 can be used as a completed chip-size double side connection package. However, on the front face side, as in the case described with reference to FIG. 10, external electrodes for external connection (bump electrodes) may be formed on the wiring traces, exposed through separation of the support portion, to be connected therewith. On the back face, external electrodes (bump electrodes) are formed such that they are connected to the back face wiring traces. If necessary, on the front face or the back face, there may be formed a protection film (formed through application of insulation film or solder resist) for protecting the upper surfaces of the wiring traces. In such a case, holes are formed in the protection film, and external electrodes are formed there.

Figure 14A:
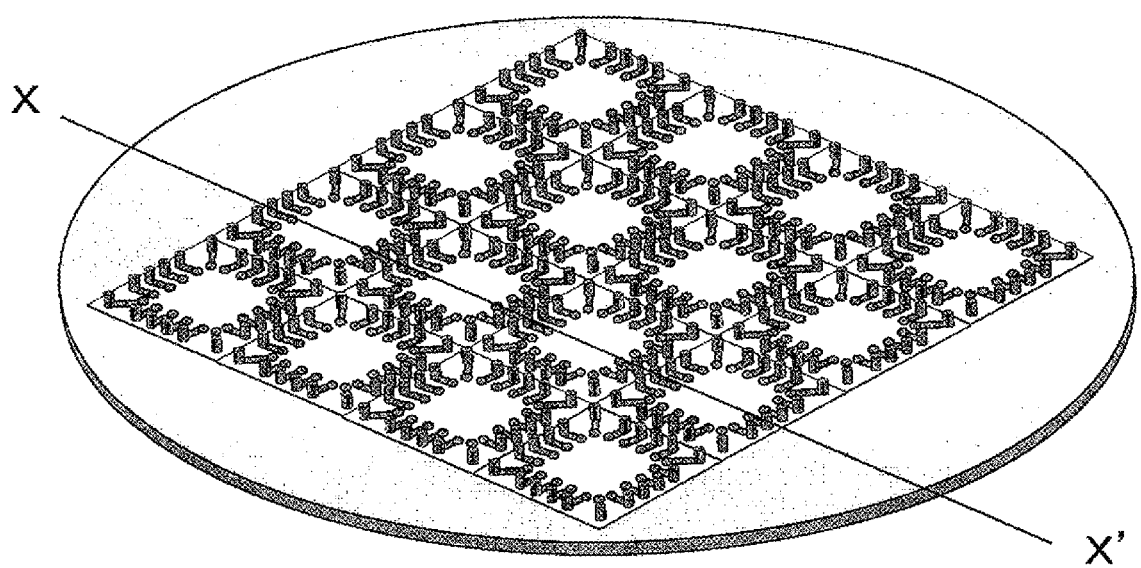
FIG. 14(A) is a perspective view showing a plurality of wiring-added post electrode components connected together.
Figure 14B:
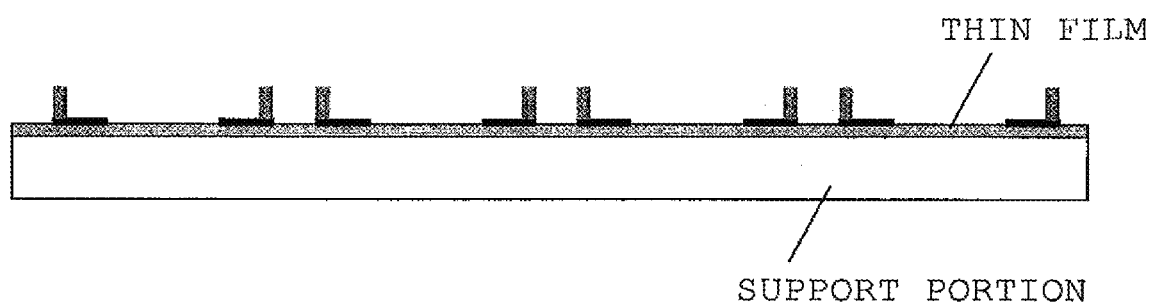
FIG. 14(B) is a cross-sectional view taken along line X-X' in FIG. 14(A).

FIGS. 14(A) and 14(B) are views showing a wiring-added post electrode component different from that shown in FIGS. 4(A) to 4(C). FIG. 14(A) is a perspective view showing a plurality of s connected together, and FIG. 14(B) is a cross-sectional view taken along line X-X' in FIG. 14(A).

Stainless steel (SUS) may be used for the support portion of the wiring-added post electrode component. However, in the case where stainless steel is used, difference in coefficient of thermal expansion between the support portion and the silicon substrate may cause a positional shift between post electrode connection positions on the wafer and the positions of the post electrodes supported by the stainless steel. In this case, desirably, a silicon substrate which is equal in thermal expansion to the above-mentioned silicon substrate or a glass substrate which is low in coefficient of thermal expansion is used.

In the case of the illustrated support portion, a tape formed from an insulation material in the form of a thin film, whose typical example is polyimide tape, is applied to the entirety of one face of the support portion. The support portion and the tape are separated from each other in a later step. Therefore, a treatment is performed in advance which treatment facilitates separation between the support portion and the tape upon application of, for example, a temperature higher than reflow temperature (equal to or higher than mold temperature). For example, adhesive containing thermal capsules is used. Alternatively, the support portion is formed of a light transmissible material (e.g., heat resistance glass which is low in thermal expansion), and an ultraviolet-ray-separation-type adhesive is used. Alternatively, a thermoplastic adhesive may be used.

Moreover, a metal seed layer which will become wiring traces is formed on this tape, whereby a metal-clad tape is formed. The seed layer may be formed of foil of gold, silver, copper, or palladium, which can be copper-plated. The wiring traces are formed through a process in which resist is applied to the seed layer, patterning is performed through exposure and development, etching is performed, and the resist is removed. A wiring layer is grown on this seed layer through plating. Furthermore, for formation of the post electrodes, application of resist and development are carried out thereon, and post portions are grown through plating. Alternatively, the wiring traces may be formed by means of directly patterning the seed layer by use of metal nanoparticles. In this case, the lithography step can be omitted (see the above-described meal particle wiring). Alternatively, it is possible to apply a copper-foil-clad tape, and form wiring traces through etching. Furthermore, for formation of the post electrodes, application of resist and development are carried out thereon, and post portions are grown through plating. Thus, the wiring-added post electrode component is completed.

Figure 15:
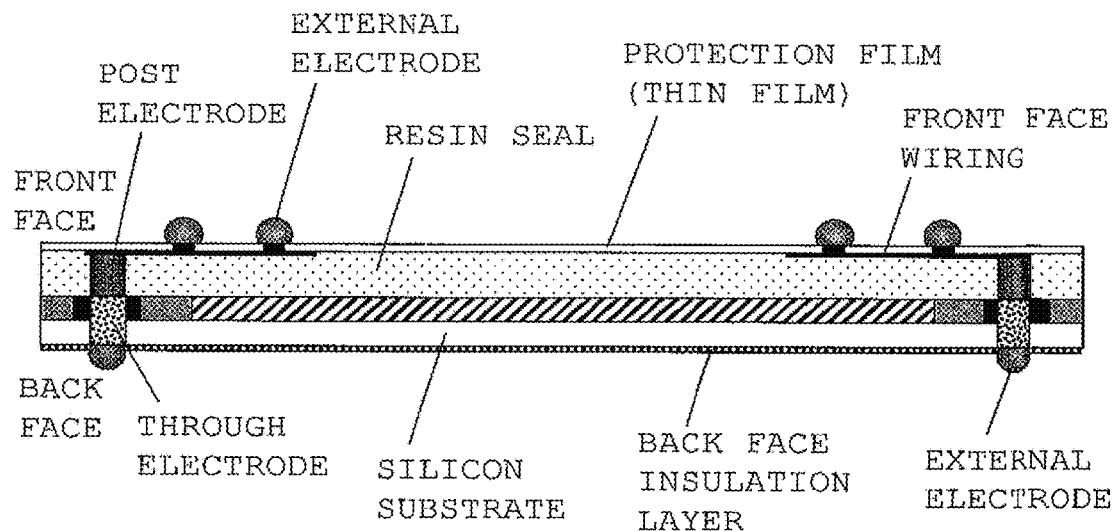
FIG. 15 is a view exemplifying a chip-size double side connection package according to a third embodiment.
Figure 16:
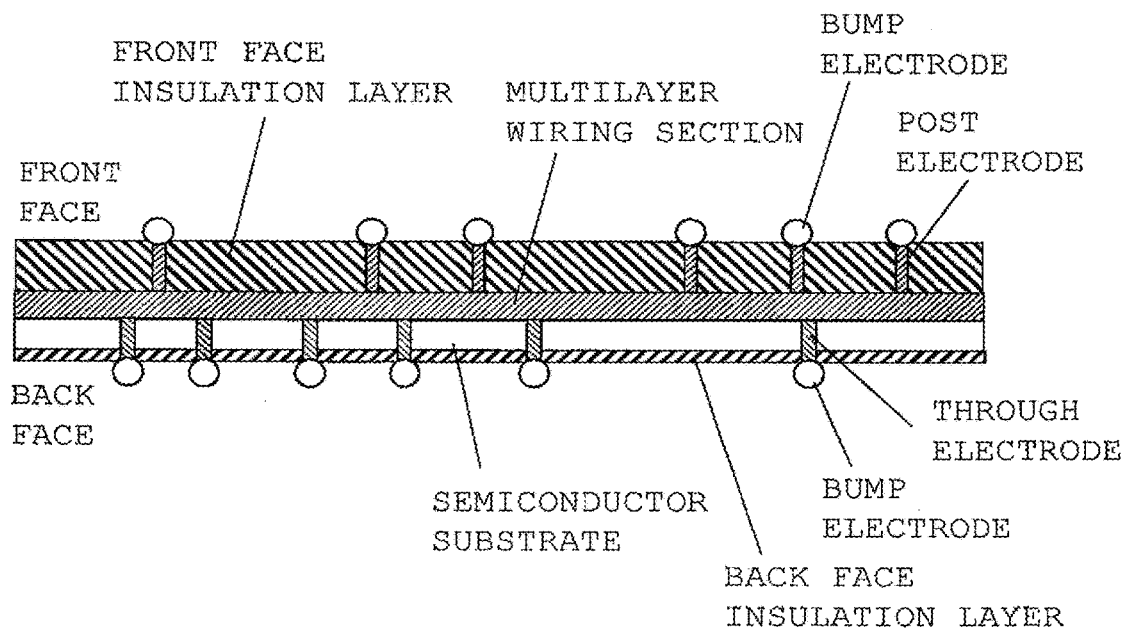
FIG. 16 is a view showing a conventional double side electrode package.

FIG. 15 is a view exemplifying a chip-size double side connection package according to a third embodiment. FIG. 15 corresponds to FIG. 10 and shows a chip-size double side connection package which can be obtained through addition of a protection film (thin film) to the chip-size double side connection package illustrated in FIG. 10. The wiring-added post electrode component illustrated in FIGS. 14(A) and 14(B) is connected and fixed to the LSI chip as in the above-described case. After that, for separation of the support portion, a predetermined high temperature is applied such that only the support portion is separated and the insulation tape of thin film remains. The exposed insulation tape functions as a protection film of a completed product. After that, on the front face side, holes are formed in the protection film, and external electrodes are formed to be connected to the front face wiring traces exposed through formation of the holes. Thus, the chip-size double side connection package according to the third embodiment is completed. Similarly, the wiring-added post electrode component illustrated in FIGS. 14(A) and 14(B) may be applied to the chip-size double side connection package according to the second embodiment (see FIGS. 11 to 13), whereby the chip-size double side connection package according to the second embodiment can have a thin film functioning as a protection film.

Although only some exemplary embodiments of the present invention have been described in detail above, many modifications are possible in the exemplary embodiments without materially departing from the novel teachings and advantageous effects of the present invention.

The invention claimed is:

1. A chip-sized microelectronic package comprising:
    a semiconductor chip including a front face, a rear face, bond pads exposed at the front face, and an LSI region at the front face;
    a plurality of through electrodes extending through openings within the bond pads, the openings and the plurality of through electrodes extending through the front and rear faces; and
    a wiring component overlying the semiconductor chip, the wiring component including:
        a resin layer having a top surface facing away from the plurality of through electrodes and a bottom surface facing toward the plurality of through electrodes;
        wiring component traces extending along the top surface of the resin layer; and
        a plurality of post electrodes extending away from the top surface of the resin layer and toward the through electrode, the plurality of post electrodes electrically connected to the wiring component traces,
    wherein the plurality of post electrodes of the wiring component are electrically connected and joined to the plurality of through electrodes.

2. The microelectronic package of claim 1, wherein the plurality of through electrodes include a low resistance metal.

3. The microelectronic package of claim 1, wherein the plurality of post electrodes are aligned with and fixed to the plurality of through electrodes.

4. The microelectronic package of claim 1, wherein the post electrodes are fixed to the bond pads.

5. The microelectronic package of claim 1, wherein the wiring component traces are configured to be directly joined with other microelectronic elements external to the package.

6. The microelectronic package of claim 1, further comprising traces joined to the plurality of through electrodes and overlying the rear face of the semiconductor chip, the traces configured to electrically join the through electrodes with devices external to the microelectronic package.

7. The microelectronic package of claim 1, wherein the plurality of through electrodes include respective ends at the rear surface of the semiconductor chip, the rear ends exposed at the rear face of the semiconductor chip so that the microelectronic package may be electrically connected with another device external to the semiconductor chip.

8. The microelectronic package of claim 7, wherein the package further includes a plurality of external electrodes respectively directly joined to the ends of the plurality of through electrodes.

9. The microelectronic package of claim 2, wherein the post electrodes are electroplated post electrodes.

10. The microelectronic package of claim 1, wherein the resin layer contacts the wiring component traces.

11. The microelectronic package of claim 1, wherein the resin layer contacts the plurality of post electrodes.

12. A chip-sized microelectronic package comprising:
a semiconductor chip including an active front face, a rear face, and bond pads exposed at the front face;
a plurality of through electrodes extending through the front and rear faces;
traces extending along the rear face of the semiconductor chip; and
a wiring component overlying the semiconductor chip and electrically connected to the semiconductor chip, the wiring component including:
a resin layer having a top surface facing away from the plurality of through electrodes and a bottom surface facing toward the plurality of through electrodes;
wiring component traces extending along the top surface of the resin layer; and
a plurality of post electrodes extending through the resin layer, each of the post electrodes joined at a first end to a respective end of the plurality of through electrodes and each of the post electrodes joined at an opposed second end to the wiring component traces.

13. The microelectronic package of claim 12, wherein the plurality of through electrodes include a low resistance metal.

14. The microelectronic package of claim 12, wherein the post electrodes are aligned with and fixed to the plurality of through electrodes.

15. The microelectronic package of claim 12, wherein the post electrodes are fixed to the bond pads.

16. The microelectronic package of claim 12, further comprising traces joined to the plurality of through electrodes and overlying the rear face of the semiconductor chip, the traces configured to electrically join the plurality of through electrodes with devices external to the microelectronic package.

17. The microelectronic package of claim 12, wherein the plurality of through electrodes include respective ends at the rear face of the semiconductor chip, the ends of the plurality of through electrodes exposed at the rear surface of the semiconductor chip so that the microelectronic package may be electrically connected with another device external to the semiconductor chip.

18. The microelectronic package of claim 17, wherein the package further includes a plurality of external electrodes respectively directly joined to the ends of the plurality of through electrodes.

19. The microelectronic package of claim 12, wherein the plurality of post electrodes are electroplated post electrodes.

20. The microelectronic package of claim 12, wherein the resin layer contacts the wiring component traces.

21. The microelectronic package of claim 12, wherein the resin layer contacts the plurality of post electrodes.

* * * * *